United States Patent
Chaichanavong et al.

(10) Patent No.: US 8,019,020 B1
(45) Date of Patent: Sep. 13, 2011

(54) BINARY DECODING FOR CORRELATED INPUT INFORMATION

(75) Inventors: Panu Chaichanavong, Mountain View, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 762 days.

(21) Appl. No.: 11/933,831

(22) Filed: Nov. 1, 2007

Related U.S. Application Data (60) Provisional application No. 60/863,849, filed on Nov. 1, 2006.

(51) Int. Cl.
*H04L 27/00* (2006.01)

(52) U.S. Cl. ........ 375/324; 375/148; 375/262; 375/340; 714/784; 714/794; 370/467

(58) Field of Classification Search .................. 375/324
See application file for complete search history.

(56) References Cited

U.S. PATENT DOCUMENTS

| | | | |
|---|---|---|---|
| 6,640,228 B1 * | 10/2003 | Handerson et al. .................. 1/1 |
| 7,017,106 B2 * | 3/2006 | Shen et al. ..................... 714/801 |
| 7,154,936 B2 * | 12/2006 | Bjerke et al. .................. 375/148 |
| 7,594,161 B2 * | 9/2009 | Lestable ....................... 714/794 |
| 2003/0061563 A1 * | 3/2003 | Venkataraman et al. ..... 714/794 |
| 2004/0210812 A1 * | 10/2004 | Cameron et al. ............... 714/746 |
| 2005/0265387 A1 * | 12/2005 | Khojastepour et al. ........ 370/467 |

OTHER PUBLICATIONS

Forney, Jr., G. David, Codes on Graphs: Normal Realizations, *IEEE Transactions on Information Theory*, 47:2, Feb. 2001, 520-548.
Kschischang, Frank R. et al., Factor Graphs and the Sum-Product Algorithm, *IEEE Transactions on Information Theory*, 47:2, Feb. 2001, 498-519.
Richardson, Tom et al., The Renaissance of Gallager's Low-Density Parity-Check Codes, *IEEE Communications Magazine*, Aug. 2003, 126-131.
Wymeersch, Henk et al., Log-domain decoding of LDPC codes over GF(q), *IEEE Communications Society*, 2004, 5 pages.

* cited by examiner

*Primary Examiner* — Shuwang Liu
*Assistant Examiner* — Lihong Yu (57) ABSTRACT

Embodiments of the present invention provide methods and systems for decoding information in a communications system with an improved bit error rate. Correlated groups of bits are grouped, and joint information of the correlated bit groups is made available to the decoder. The decoder takes advantage of the joint information to improve the error rate.

14 Claims, 7 Drawing Sheets

BINARY DECODING FOR CORRELATED INPUT INFORMATION

RELATED APPLICATIONS

This application claims the benefit of priority to U.S. Provisional Application No. 60/863,849 filed Nov. 1, 2006, titled "Binary LDPC Decoding for Correlated Input Information," which is herein incorporated by reference in its entirety.

TECHNICAL FIELD

The invention is generally related to methods and systems for improved binary decoding based on correlated input information.

BACKGROUND

Figure 1:
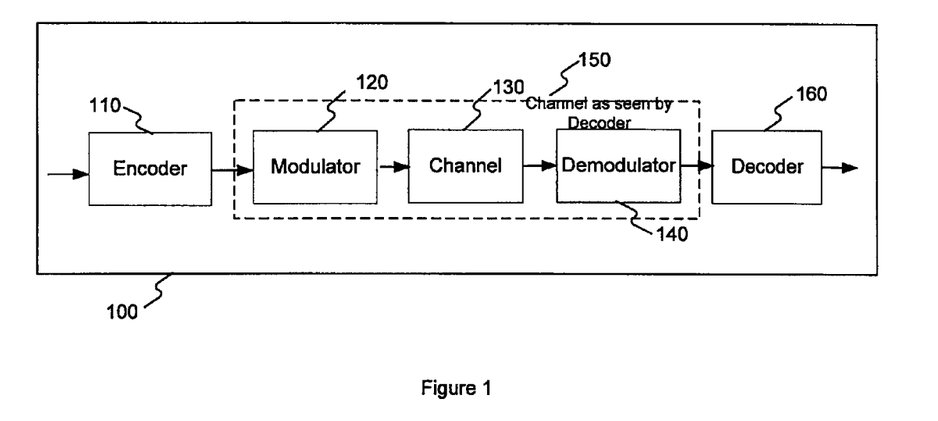
FIG. 1 is a block diagram showing a conventional communication system with an LDPC code.

Low density parity check (LDPC) codes are widely used to correct errors in transmission in communications channels. FIG. 1 shows an exemplary conventional communication system 100 comprising an LDPC code. As shown in FIG. 1, encoder 110 takes user data and generates a codeword that is modulated into an appropriate signal (e.g. voltage, electromagnetic wave) by modulator 120 and transmitted through the channel 130. Demodulator 140 demodulates the signal and provides information or messages that are suitable for LDPC decoding. Typical LDPC decoders use a message transmission process that iteratively refines the encoded information to obtain the transmitted data. Modulator 120, channel 130 and demodulator 140 may be referred to collectively as the "channel" 150.

There exist many known decoding algorithms. In general, the term soft-input, soft-output (SISO) algorithm is used to denote an algorithm that can take an inputted signal with any number of levels and output an equivalent signal. Many SISO algorithms use probability or log-likelihood ratio (LLR) information to reduce errors in the data stream. The iterative use of SISO algorithms is also a known method for error correction. Many of the existing algorithms are, however, very complex to implement and require an unacceptably high computational effort that reduces performance of the communications system.

If the input information is highly correlated, the performance of a decoder can be improved by taking advantage of the correlated information. A conventional way to improve binary decoding of correlated input information is to exchange soft information between the detector (and/or modulator) and the decoder. Another approach is to replace the binary LDPC code with a non-binary LDPC code. However, these two solutions are often very complex to implement.

What is needed are methods and systems for improving performance of a decoder in ways that are less complex, easier to implement, and/or more accurate than conventional methods and systems.

SUMMARY

Consistent with the invention, a method, system and apparatus for reducing bit errors during decoding in a communications system are presented. The method, system and apparatus may include identifying a group of correlated encoded bits from a bit stream in a communication channel, determining marginal extrinsic information for each bit of the group, receiving joint prior information of the group of correlated encoded bits; determining joint extrinsic information based on the marginal extrinsic information, calculating joint posterior information based on the joint extrinsic information and joint prior information of the group of correlated encoded bits, obtaining marginal posterior information for each bit in the group based on the joint posterior information, combining the marginal extrinsic information for each bit with the marginal posterior information for each bit, and decoding the combined information.

In an alternated embodiment, an apparatus for reducing bit errors during decoding is presented. The apparatus may include means for receiving a group of correlated encoded bits from a bit stream in a communication channel, means for receiving joint prior information of the group of correlated encoded bits, means for determining marginal extrinsic information for each bit of the group, determining joint extrinsic information based on the marginal extrinsic information, means for calculating joint posterior information based on the joint extrinsic information and the joint prior information of the group of correlated encoded bits, means for obtaining marginal posterior information for each bit in the group based on the joint posterior information, means for combining the marginal extrinsic information for each bit with the marginal posterior information for each bit, and means for providing the combined information to a decoder.

In another alternate embodiment, a communications system is presented that may include logic for identifying a group of correlated encoded bits from a bit stream in a communication channel, means for receiving joint prior information of the group of correlated encoded bits, a demodulator for, determining marginal extrinsic information for each bit of the group, determining joint extrinsic information based on the marginal extrinsic information, calculating joint posterior information based on the joint extrinsic information and the joint prior information of the group of correlated encoded bits, obtaining marginal posterior information for each bit in the group based on the joint posterior information, combining the marginal extrinsic information for each bit with the marginal posterior information for each bit, and providing the combined information to a decoder for decoding; and a decoder for outputting a decoded bit stream.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments consistent with the invention and together with the description, serve to explain the principles of the invention. In the drawings.

DESCRIPTION OF THE EMBODIMENTS

Embodiments of the present invention provide methods and systems for decoding information in a communications system. Correlated groups of bits are grouped, and both marginal and joint information of the correlated bit groups are made available to the decoder. Reference will now be made in detail to exemplary embodiments, examples of which are illustrated in the accompanying drawings. Wherever possible, the same reference numbers will be used throughout the drawings to refer to the same or like parts. While embodiments of the invention may be described below with reference to LDPC codes, one skilled in the art will understand that the principles of the inventions may be used with any SISO decoder. In some embodiments, however, the structured LDPC code may be preferred due, at least in part, to its simplicity.

In the descriptions of embodiments of the invention, reference will be made to many of the following well-known principles and concepts. A conventional LDPC code may be represented by a parity-check matrix H. A vector c is a codeword of the LDPC code if Hc=0. For example, let $$H = \begin{bmatrix} 1 & 1 & 1 & 0 & 0 \\ 1 & 0 & 0 & 1 & 1 \\ 0 & 1 & 1 & 1 & 1 \end{bmatrix}. \quad (1)$$

Figure 2:
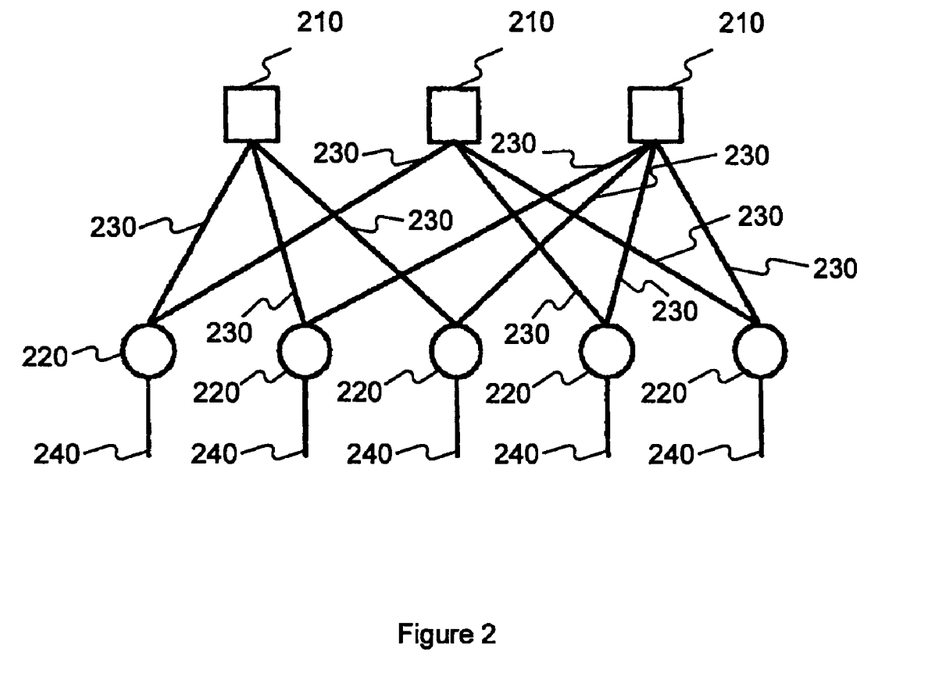
FIG. 2 is a diagram showing a Tanner graph of a parity-check matrix.

Equivalently, the code can also be represented by a Tanner graph, as shown in FIG. 2. The number of check nodes is equal to the number of check equations (i.e., number of rows of H). Check node i is connected to bit node j if $H_{i,j}=1$.

FIG. 2 shows check nodes 210, bit nodes 220, and check-to-bit messages 230. A bit node represents a binary quantity that the decoding process seeks to determine. The number of bit nodes is equal to the length of the code. There may be an edge (not shown) connecting a bit node and a check node when the corresponding entry in parity-check matrix is 1. In FIG. 2, edges 240 are shown beneath bit nodes 220.

FIG. 2 is the corresponding Tanner graph to parity-check matrix, H, above. It can be seen that the columns of matrix, H, represent the inputs to the bit nodes, while the rows of H correspond to the check equations of the check nodes.

Figure 3:
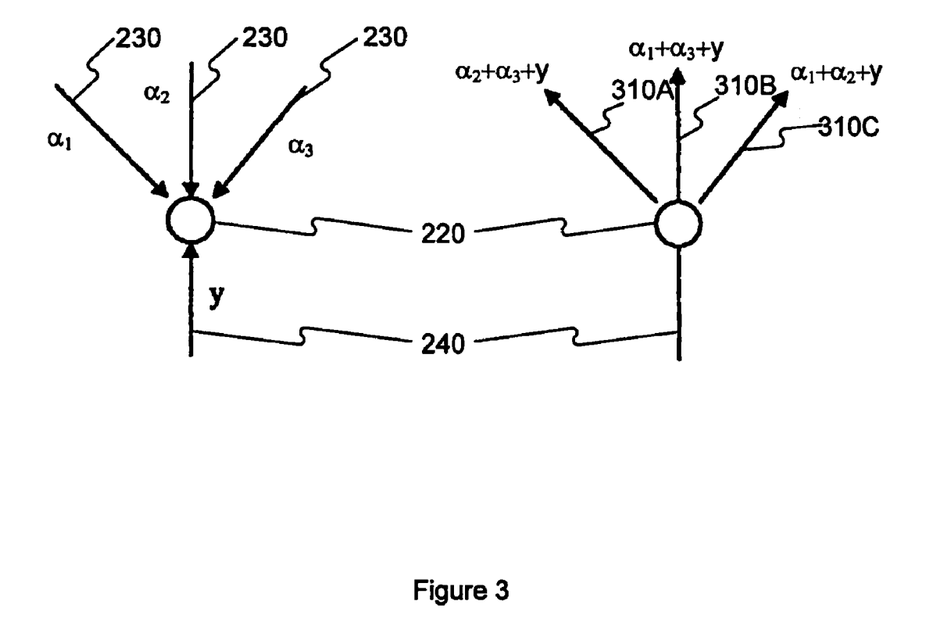
FIG. 3 is a diagram showing bit node computations.

FIG. 3 is a diagram showing standard bit node computations. In FIG. 3, bit-to-check messages 310A, 310B, and 310C for an edge of a bit node 220 may be computed from a sum of check-to-bit messages 230 and channel prior information, y, received by bit node 220. Prior channel information, y, may be calculated by subtracting marginal extrinsic $E_i$ from marginal posterior $LLR_p$, as described in more detail below. Prior y may be marginal prior information and may be written as $LLR(x_i)$. Bit node 220 sums all received transmissions and then sends a transmission to edge 240 or a check node (not shown).

Joint probability, or "joint information," is the likelihood of two or more bits to contain data jointly. Marginal probability, or "marginal information," is the likelihood of two or more bits to contain data separately. Joint and marginal probability or information for a bit or group of bits may be explained by the following example using two bits, denoted by u and v. In the following example, the known combinations of uv are 00, 01, 10, and 11 and the probability or information for uv is: Pr(uv=00)=0.1, Pr(uv=01)=0.2, Pr(uv=10)=0.3, and Pr(uv=11)=0.4. The marginal probabilities or information for u and v may be calculated from joint probabilities of uv. Using the example above, the marginal probability or information for u being 0 is Pr(u=0)=Pr(uv=00)+Pr(uv=01)=0.1+0.2=0.3 and the marginal probability or information for v being 0 is Pr(v=0)=Pr(v=00)+Pr(v=10)=0.1+0.3=0.4.

Typically, it is difficult to calculate joint probability for two bits from marginal probability for each bit because many different joint probabilities may correspond to the same marginal probability. For example, Pr(uv=00)=0.12, Pr(uv=01)=0.18, Pr(uv=10)=0.28, Pr(uv=11)=0.42 also have marginal probabilities Pr(u=0)=0.3, Pr(v=0)=0.4. However, if u and v are assumed to be independent, then joint probabilities of uv may be calculated from marginal probabilities of u and y separately by Pr(uv)=Pr(u)Pr(v). For example, Pr(uv=00)=Pr(u=0)Pr(v=0)=0.3*0.4=0.12. This technique may be used when joint probability is needed and the correlation of u and v is unknown.

When a group has m bits, $X_{m1}=x_1 \ldots x_m$, the joint information of the group may be represented by a vector of length $2^{m-1}$:

$$\left[ \log\frac{Pr(x_1^m = 0 \ldots 01)}{Pr(x_1^m = 0 \ldots 00)} \log\frac{Pr(x_1^m = 0 \ldots 10)}{Pr(x_1^m = 0 \ldots 00)} \log\frac{Pr(x_1^m = 0 \ldots 11)}{Pr(x_1^m = 0 \ldots 00)} \ldots \right. \quad (2)$$

$$\left. \log\frac{Pr(x_1^m = 0 \ldots 11)}{Pr(x_1^m = 0 \ldots 00)} \right]^T$$

whereas the marginal information for bits $x_1, x_2, \ldots x_m$ may be calculated as LLRs as shown below:

$$\log\frac{Pr(x_1 = 1)}{Pr(x_1 = 0)}, \log\frac{Pr(x_2 = 1)}{Pr(x_2 = 1)} \ldots \log\frac{Pr(x_m = 1)}{Pr(x_m = 0)}. \quad (3)$$

The marginal information can be calculated from the joint vector information. Entries of the joint information vector are noted as $L(\alpha_1^m)$, where $\alpha_1^m$ ranges over all binary words of size m. Although $L(0 \ldots 00)$ is typically not included in the information vector since it is always zero, sometimes it is convenient to use it to describe the process of LDPC decoding. Generally, the marginal LLR for $x_i$ may be calculated from the joint LLR as follows:

$$LLR(x_i) = \log\frac{Pr(x_i = 1)}{Pr(x_i = 1)} = \quad (4)$$

$$\log\frac{\sum_{a_i=1} Pr(x_1^m = a_1^m)}{\sum_{a_i=0} Pr(x_1^m = a_1^m)} = \log\frac{\sum_{a_i=1} \exp(L(a_1^m))}{\sum_{a_i=0} \exp(L(a_1^m))} = \log\left(\sum_{a_i=1} \exp(L(a_1^m))\right) -$$

$$\log\left(\sum_{a_i=0} \exp(L(a_1^m))\right) \approx \max_{a_i=1} L(a_1^m) - \max_{a_i=0} L(a_1^m).$$

The above calculation does not distinguish whether the LLR is a prior LLR, an extrinsic LLR, or a posterior LLR. However, it may be used to calculate marginal posterior LLR, $(LLR_p(x_i))$.

Generally, three types of information may be used in decoding. "Channel information" or "prior information" is the likelihood of the transmitted data given the received signal without the knowledge of code, that is, prior to decoding. "Posterior information" is the likelihood of data after decoding. "Extrinsic information" is the difference between posterior and channel information. It represents how the likelihood is changed after taking the code into account.

Figure 4:
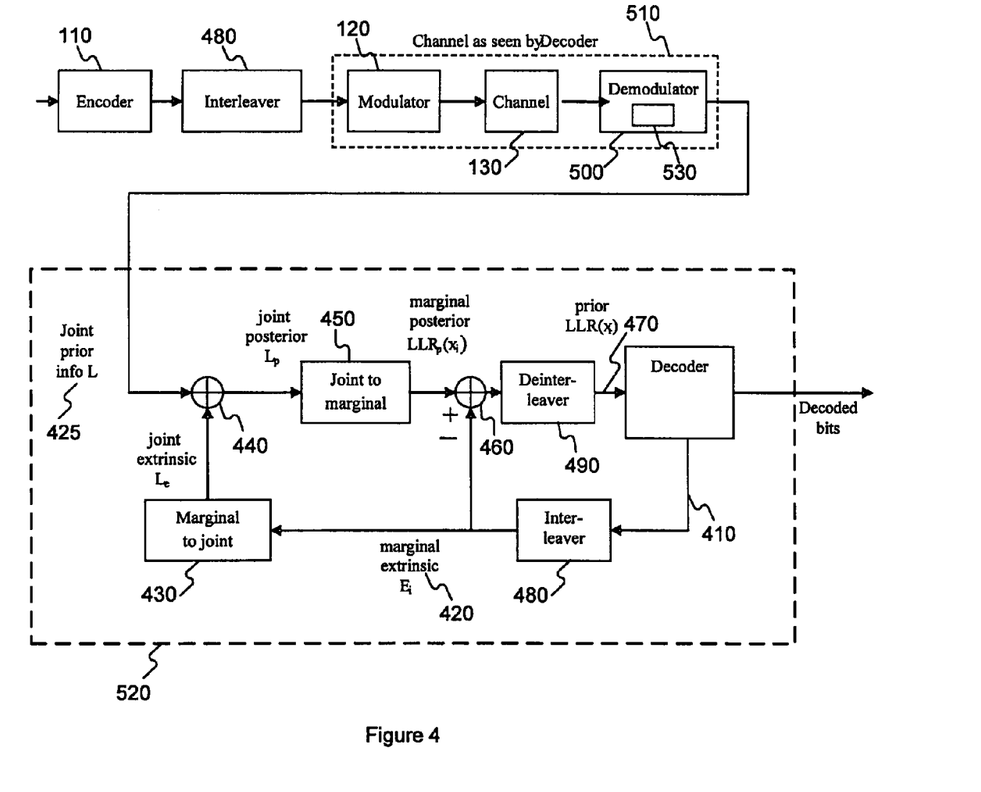
FIG. 4 is a diagram showing an exemplary implementation of a decoding algorithm consistent with the present invention.

FIG. 4 shows one example of a decoding process using correlated information, consistent with the present invention. The usual decoding process is begun and executed for some number of iterations. The number of iterations of the usual decoding process that are performed may be any number and will vary depending on the decoding algorithm. For example, when LDPC coding is used, the additional steps may be run after only one iteration. Alternatively, the following process may be performed from the beginning, however, in the first iteration of the decoding process, the marginal extrinsic information, $E_i$, are zero, so the information from the bit nodes to the check nodes is just the marginal extrinsic information of the bits, or channel vector L.

Encoder 110 may receive data and transmit it to an interleaver 480. In some embodiments of the present invention, interleaver 480 may be used to shuffle the channel information prior to transmission. Interleaving is commonly used in data transmission to protect the transmission against, for example, burst errors or other corruptive occurrences that overwrite many bits in a row. In decoders where the data stream is encoded using a structured binary soft-input soft-output code (e.g., quasi-cyclic), two adjacent bit nodes may provide into to the same set of check nodes. If the bit stream becomes corrupted, it is then likely that many check nodes receive unreliable channel information. Using interleaver 480 prior to transmission reduces the possibility that adjacent bits will become corrupted during transmission.

However, shuffling the bits in a data stream also masks the correlation of adjacent bits in the data stream. Therefore, in embodiments using an interleaver, a deinterleaver 490, preferably one using the inverse process of interleaver 480, may also be used to restore the shuffled bits to their consecutive positions prior to sampling. Deinterleaver 490 may deinterleave marginal posterior information $LLR_p(x_i)$, or marginal prior information $LLR(x_i)$. A second interleaver 480 may interleave the marginal extrinsic information $LLR_e(x_i)$ before computing joint extrinsic information $L_e$.

After interleaving, data may be sent to a channel as seen by decoder 510. Channel as seen by decoder 510 may include modulator 120, channel 130, and a demodulator 500. Demodulator 500 may include a detector 530. Demodulator 500 and/or detector 530 may be modified to support decoder 520 so that, for example, it gives joint LLR instead of marginal LLR.

A group of bits from the communications channel is identified (410). The number of bits, m, may be any number. In at least some embodiments, the group of bits is chosen so as to contain correlated information. In some embodiments, choosing a larger group size m may improve performance particularly if, for example, the circumstances of a particular data stream indicate that a large number of bits are correlated. Therefore, the number of bits in a group may depend on a number of factors, such as, the type of transmission channel used, and the complexity of the decoder, among others. The number of correlated bits may also depend, for example, on the type of application. In an 8-PAM transmission, for example, each signal point in the constellation represents 3 bits. The bits in a signal point of the constellation are likely to be correlated. Group size, m, may be set a priori or, in at least some embodiments, may be determined during operation of the communications channel, such as by a detector. A user, designer, circuit, or software program may be used to determine, for example, which bits are correlated and/or how many bits in a data stream contain correlated information. The number of bits may be fixed or variable. The degree of variation in the number of bits may be limited by the detector 530 and/or decoder 520.

The extrinsic information of each bit in the group of bits is determined. (420). For example, the extrinsic information, $E_i$, for bit node $x_i$ may be represented as the sum of the messages, $\alpha_i$, from the check nodes to bit node $x_i$, or:

$$E_i = \alpha_i + \ldots + \alpha_k. \quad (5)$$

The marginal extrinsic information may be converted to a joint extrinsic information vector ($L_e$) (430). One exemplary method for calculating ($L_e$) is represented by the following equation:

$$L_e(a_1^m) = \sum_{i=1}^{m} a_i E_i. \quad (6)$$

For example, if m=3, $$L_e = \begin{bmatrix} E_3 \\ E_2 \\ E_2 + E_3 \\ E_1 \\ E_1 + E_3 \\ E_1 + E_2 \\ E_1 + E_2 + E_3 \end{bmatrix}. \quad (7)$$

$L_e$ (000) is omitted because it is always zero.

Joint prior information, L 425 and joint extrinsic vector, $L_e$, may be summed to obtain a joint posterior vector $L_p$ as represented by $L_p = L + L_e$ (440).

The joint posterior vector $L_p$, is converted to marginal information $LLR_p$ for bit $x_i$ (450) The marginal information LLR (or channel information) for each bit $x_i$ may be computed as:

$$LLR(x_i) = LLR_p(x_i) - E_i. \quad (8)$$

$LLR_p(x_i)$ is computed using equation (4) above. In the second line of equation (4), the so-called max* operation is used to calculate $LLR_p(x_i)$. Another way to represent the max* operation of two numbers x and y is: max*$\{x,y\}$=log(exp(x)+exp(y)). To reduce implementation complexity, the results of the max* operation may be approximated by using only the max operation. New channel information $LLR(x_i)$ is then provided to the decoder (470).

This procedure is repeated as often as necessary or may be repeated until a pre-specified condition is met. A pre-specified condition may be, for example, a maximum repetition of the decoding process, a degree of clarity of the decoded information, or a hard decision like a LDPC codeword.

With further reference to FIG. 4, an embodiment of the invention is shown by way of a specific numerical example that is for exemplary purposes only and is not meant to limit the invention. In this specific example, the group size m is set to be 3 bits. In this specific numerical example channel vector L is:

$$L = [10\ -5\ -11\ -8\ 2\ 3\ 9]^T \quad (9)$$

In the first iteration, the extrinsic $E_i$ are zero, so bit-to-check messages are the marginal information of L:

$LLR(x_1)$=max$\{-8,2,3,9\}$−max$\{0,10,-5,-11\}$=−1

$LLR(x_2)$=max$\{-5,-11,3,9\}$−max$\{0,10,-8,2\}$=−1

$LLR(x_3)$=max$\{10,-11,2,9\}$−max$\{0,-5,-8,3\}$=7. \quad (10)

Figure 5:
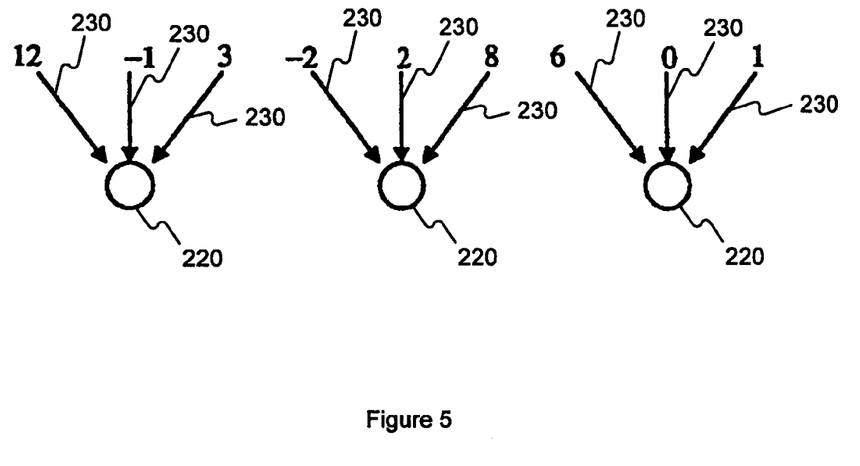
FIG. 5 is a diagram showing check node to bit node transmissions for a specific numerical example.
Figure 6:
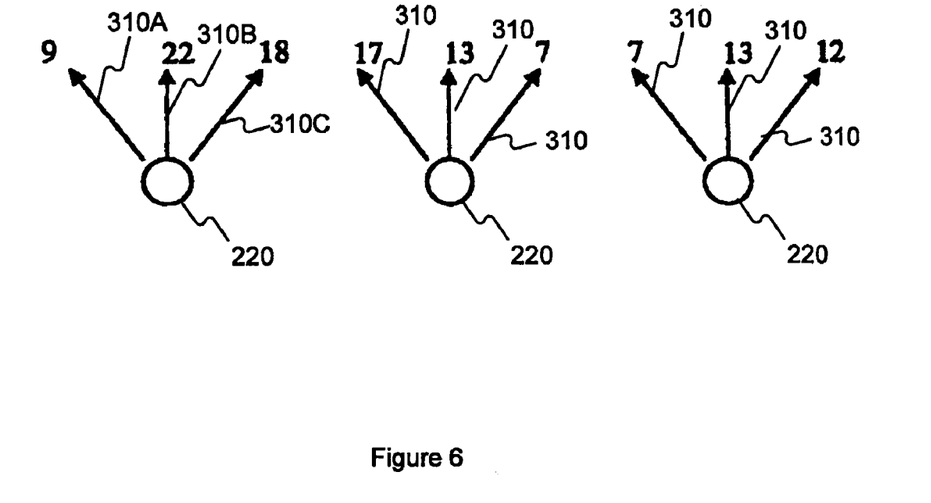
FIG. 6 is a diagram showing bit node to check node transmissions for the same specific numerical example.

FIG. 5 is a diagram showing check-to-bit messages 230 for this particular example. Check-to-bit messages 230 are sent from check nodes 210 (not shown) to bit nodes 220. As shown in FIG. 6, in this particular example, a first bit node 220 receives check-to-bit messages 230 of 12, −1, and 3; a second bit node 220 receives check-to-bit messages 230 of −2, 2, and 8; and a third bit node 220 receives check-to-bit messages 230 of 6, 0 and 1.

The marginal extrinsic information (420) for the first, second, and third bit nodes 220 may be calculated as follows:

$$E_1=12-1+3=14, E_2=-2+2+8=8, E_3=6+0+1=7. \quad (11)$$

Using the marginal extrinsic information from the above calculation, the joint extrinsic information vector may be calculated (430) by, for example, using equation (6) above or other suitable method. The joint extrinsic information vector in this example is then:

$$L_e=[7\ 8\ 15\ 14\ 21\ 22\ 29]^T. \quad (12)$$

A joint posterior information vector $L_p$ may be calculated (440) using channel vector L and the extrinsic information vector $L_e$ as shown below.

$$L_p=L+L_e=[17\ 3\ 4\ 6\ 23\ 25\ 38]^T. \quad (13)$$

The marginal posterior information, $LLP_p$ for $x_1$, $x_2$, and $x_3$ may then be calculated from the joint information (450). In this example, that calculation is as follows:

$$LLR_p(x_1)=\max\{6,23,25,38\}-\max\{0,17,3,4\}=21,$$

$$LLR_p(x_2)=\max\{3,4,25,38\}-\max\{0,17,6,23\}=15,$$

$$LLR_p(x_3)=\max\{17,4,23,38\}-\max\{0,3,6,25\}=13. \quad (14)$$

The next step is to combine the extrinsic information, $E_i$, with the marginal posterior information (460).

Figure 7:
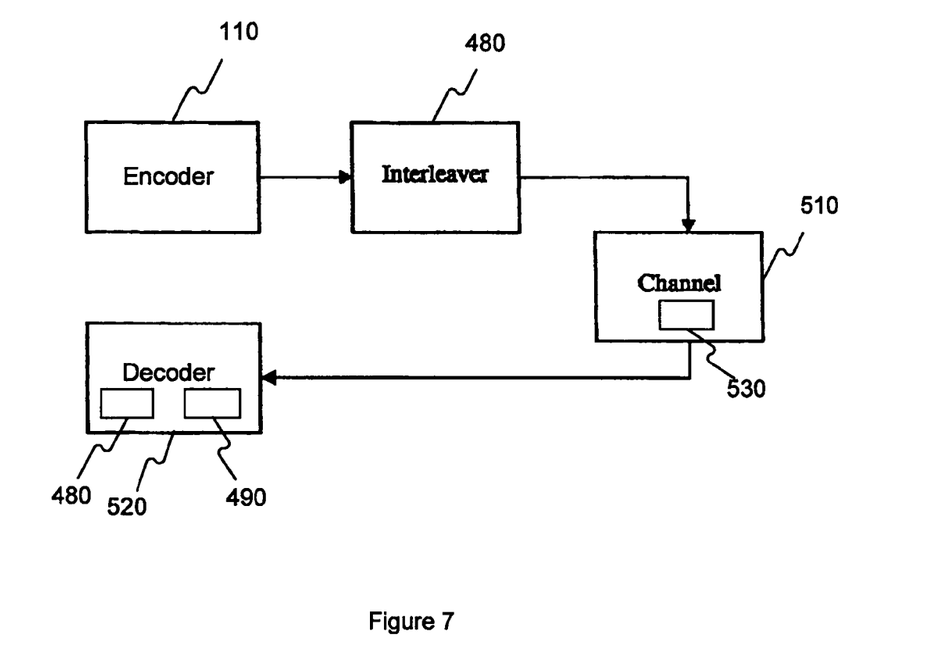
FIG. 7 is a block diagram showing an exemplary system for decoding consistent with embodiments of the present invention.

FIG. 6 is a diagram showing bit-to-check messages 310, for the specific numerical example. Bit-to-check messages 310 are sent from bit nodes 220. Each bit-to-check message 310 is calculated in this example according to the equations used in FIG. 3. For example, bit-to-check messages 310A equals $\alpha_2+\alpha_3+y$, which can also be written as $\alpha_2+\alpha_3+(LLR_p(x_1)-E_1)$. Use the values of the specific numerical example, bit-to-check message 310A then equals −1+3+7=9, as shown in FIG. 7. Similarly, bit-to-check message 310B will equal $\alpha_1+\alpha_3+(LLR_p(x_2)-E_2)=12+3+7=22$ and bit-to-check message 310C will equal $\alpha_1+\alpha_2+(LLR_p(x_3)-E_3)=12-1+7=18$. An alternative way to calculate bit-to-check messages 310A is $LLR_p(x_1)-\alpha_1$, which gives the same result as the calculation above and may reduce complexity in some cases.

FIG. 7 shows encoder 110, interleaver 480, channel 510, and binary decoder 520. Channel 510 may include a detector 530 and binary decoder 160 may include an additional interleaver 480 and deinterleaver 490.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for reducing bit errors during decoding in a communications system, the method comprising:
    identifying a group of correlated encoded bits from a bit stream in a communication channel;
    receiving joint prior information of the group of correlated encoded bits;
    determining marginal extrinsic information for each bit of the group of correlated encoded bits;
    determining joint extrinsic information based on the marginal extrinsic information;
    calculating joint posterior information based on the joint extrinsic information and the joint prior information of the group of correlated encoded bits;
    obtaining marginal posterior information for each bit in the group of correlated encoded bits based on the joint posterior information;
    combining the difference of (i) the marginal extrinsic information for each bit and (ii) the marginal posterior information for each bit; and
    decoding the combined information.

2. The method of claim 1, wherein the marginal posterior information is calculated using a max* operation.

3. The method of claim 1, wherein the marginal posterior information is approximated using a max operation.

4. The method of claim 1, wherein the number of bits in the group of correlated encoded bits is determined by a detector.

5. The method of claim 1, wherein the bit stream was interleaved prior to transmission, and the method further comprises:
    deinterleaving the marginal posterior or prior information before the decoding; and
    interleaving the marginal extrinsic information before determining joint extrinsic information.

6. The method of claim 1, wherein the number of bits in the group of correlated encoded bits is variable.

7. An apparatus for reducing bit errors during decoding, the apparatus comprising:
    means for receiving a group of correlated encoded bits from a bit stream in a communication channel;
    means for receiving joint prior information of the group of correlated encoded bits;
    means for determining marginal extrinsic information for each bit of the group of correlated encoded bits;
    determining joint extrinsic information based on the marginal extrinsic information;
    means for calculating joint posterior information based on the joint extrinsic information and the joint prior information of the group of correlated encoded bits;
    means for obtaining marginal posterior information for each bit in the group of correlated encoded bits based on the joint posterior information;
    means for combining the difference of (i) the marginal extrinsic information for each bit and (ii) the marginal posterior information for each bit; and
    means for providing the combined information to a decoder.

8. The apparatus of claim 7, wherein the marginal posterior information is calculated using a max* operation.

9. The apparatus of claim 7, wherein the marginal posterior information is approximated using a max operation.

10. A communications system comprising:
    logic configured to identify a group of correlated encoded bits from a bit stream in a communication channel;
    a demodulator configured to
    determine marginal extrinsic information for each bit of the group,
    determine joint extrinsic information based on the marginal extrinsic information,
    calculate joint posterior information based on the joint extrinsic information and joint prior information of the group of correlated encoded bits, obtain marginal posterior information for each bit in the group based on the joint posterior information, combine the difference of the (i) marginal extrinsic information for each bit and (ii) the marginal posterior information for each bit, and provide the combined information to a decoder for decoding; and a decoder configured to decode the combined information to generate a decoded bit stream.

11. The system of claim 10, wherein the marginal posterior information is calculated using a max* operation.

12. The system of claim 10, wherein the marginal posterior information is approximated using a max operation.

13. The system of claim 10, further comprising:

a detector configured to determine the number of correlated encoded bits to be grouped together.

14. The system of claim 10, wherein the bit stream was interleaved prior to transmission, and the system further comprises:

a deinterleaver configured to deinterleave the marginal posterior or prior information before the decoding; and an interleaver configured to interleave the marginal extrinsic information before determining joint extrinsic information.

* * * * *